(12) United States Patent
Hoshi et al.

(10) Patent No.: US 12,507,452 B2
(45) Date of Patent: Dec. 23, 2025

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Yasuyuki Hoshi, Matsumoto (JP); Shingo Hayashi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 388 days.

(21) Appl. No.: 18/340,278

(22) Filed: Jun. 23, 2023

(65) Prior Publication Data
US 2024/0047532 A1 Feb. 8, 2024

(30) Foreign Application Priority Data
Aug. 3, 2022 (JP) ................. 2022-123752

(51) Int. Cl.
H10D 62/832 (2025.01)
H10D 12/01 (2025.01)
(Continued)

(52) U.S. Cl.
CPC ....... H10D 62/8325 (2025.01); H10D 12/031 (2025.01); H10D 30/665 (2025.01); H10D 30/668 (2025.01); H10D 84/143 (2025.01)

(58) Field of Classification Search
CPC ............. H10D 62/8325; H10D 12/031; H10D 30/665; H10D 30/668; H10D 84/143; H10D 8/60; H10D 12/038; H10D 64/252; H10D 84/144; H10D 62/393; H10D 62/112; H10D 62/106; H10D 2/107; H10D 30/0297; H01L 3/3192; H01L 23/552; H01L 21/56
See application file for complete search history.

(56) References Cited

U.S. PATENT DOCUMENTS

2003/0160887 A1* 8/2003 Takahashi ............... H10F 30/24 348/222.1
2018/0366499 A1* 12/2018 Kobayashi ............. H04N 25/63
2022/0044980 A1 2/2022 Sato et al.

FOREIGN PATENT DOCUMENTS

JP 6443029 B2 12/2018
JP 6892997 B2 6/2021
WO 2020/136759 A1 7/2020

* cited by examiner

Primary Examiner — Thanh Y. Tran
(74) Attorney, Agent, or Firm — Rabin & Berdo, P.C.

(57) ABSTRACT

A silicon carbide semiconductor device has a first semiconductor region of a first conductivity type, provided in a semiconductor substrate, spanning an active region and a termination region. A second semiconductor region of a second conductivity type is provided between a first main surface and the first semiconductor region, in the active region. A device structure having a first pn junction is provided between the first and second semiconductor regions. An outer peripheral portion of the active region is provided between the first main surface and the first semiconductor region in the active region, and constitutes a second-conductivity-type outer peripheral region that surrounds a periphery of the device structure and forms a second pn junction with the first semiconductor region. A first protective film is provided on the first main surface. The first protective film blocks light generated by a forward current passing through the first and second pn junctions.

14 Claims, 7 Drawing Sheets

(51) Int. Cl.
*H10D 30/66* (2025.01)
*H10D 84/00* (2025.01)

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-123752, filed on Aug. 3, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next-generation semiconductor material. Compared to a conventional semiconductor device element that uses silicon as a semiconductor material, a semiconductor device that uses silicon carbide as a semiconductor material (hereinafter, silicon carbide semiconductor device) has various advantages such as enabling resistance of a device in an ON state to be reduced to a few hundredths and application under higher temperature (200 degrees C. or higher) environments. These advantages are due to characteristics of the material itself in that a bandgap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area as well as current density per unit area may be increased, which are advantageous in terms of cost.

FIG. 6 is a cross-sectional view depicting a structure of an active region of a conventional silicon carbide semiconductor device. FIG. 7 is a cross-sectional view depicting a structure of an edge termination region the conventional silicon carbide semiconductor device. A conventional silicon carbide semiconductor device 110 depicted in FIGS. 6 and 7 is a vertical MOSFET having a trench structure that, in an edge termination region 102 of a semiconductor substrate (semiconductor chip) 140 thereof that contains silicon carbide, has a voltage withstanding structure 130.

The semiconductor substrate 140 is formed by epitaxially growing, on a front surface of an $n^+$-type starting substrate 141 that contains silicon carbide an $n^-$-type silicon carbide layer 142 that constitutes, an $n^-$-type drift region 112. The semiconductor substrate 140 has, as a front surface, a main surface that has the $n^-$-type silicon carbide layer 142 and has, as a back surface, a main surface that has the $n^+$-type starting substrate 141. An entire area of the front surface of the semiconductor substrate 140 has a flat surface, that is, no step is formed between an active region 101 and the edge termination region 102. At the front surface of the semiconductor substrate 140, an entire area of the edge termination region 102 is covered by an interlayer insulating film 119.

In an entire area of the back surface (back surface of the $n^+$-type starting substrate 141) of the semiconductor substrate 140, a drain electrode 145 is provided. The $n^+$-type starting substrate 141 constitutes an $n^+$-type drain region 111. The active region 101 is disposed in a center (chip center) of the semiconductor substrate 140. The edge termination region 102 is between the active region 101 and an end (chip end) of the semiconductor substrate 140.

In a center portion 101a (FIG. 6) of the active region 101, multiple unit cells, each having the same MOSFET structure (the trench structure), are provided adjacent to one another. The $n^-$-type drift region 112 has a first surface and a second surface opposite to each other, the second surface facing the $n^+$-type starting substrate 141 and in the center portion 101a of the active region 101, an n-type current spreading region 120 is provided at the first surface of the $n^-$-type drift region 112. In the n-type current spreading region 120, at the surface thereof, $p^+$-type regions 122, each configured by a lower $p^+$-type region portion 123 and an upper $p^+$-type region portion 124, are selectively provided between trenches 116, which are adjacent to one another. Further, in the n-type current spreading region 120, $p^+$-type regions 121 are selectively provided at positions facing bottoms of the trenches 116 in a depth direction of the conventional silicon carbide semiconductor device 110.

MOS gates of the trench structure are configured by p-type base regions 113, $n^+$-type source regions 114, $p^{++}$-type contact regions 115, the trenches 116, gate insulating films 117, and gate electrodes 118.

Further, the interlayer insulating film 119 is provided on the gate electrodes 118 and ohmic electrodes 143 that are in contact with the $n^+$-type source regions 114 and the $p^{++}$-type contact regions 115 are provided in contact holes of the interlayer insulating film 119. A barrier metal 138 that prevents diffusion of metal atoms to the gate electrodes 118 is provided on the ohmic electrodes 143 and the interlayer insulating film 119. A source electrode 144 is provided on the barrier metal 138.

Further, to prevent spreading of ions into the semiconductor device and to insulate and protect the semiconductor device, a protective film 134 is deposited on the interlayer insulating film 119 in the edge termination region 102, and on the source electrode 144 in the active region 101. An opening (not depicted) is provided in the protective film 134, and a portion of the source electrode 144 exposed in the opening of the protective film 134 constitutes a source pad. Conventionally, as a protective film, while an inorganic material such as a silicon nitride (SiN) film, an oxide film, etc. is used, a polyimide film constituting an organic material is often used. To insulate and protect the semiconductor chip, the silicon carbide semiconductor device has a case (not depicted) that is filled with a sealing resin 137 such as a hard resin like an epoxy or a gel.

In an outer peripheral portion 101b of the active region 101, the p++-type contact regions 115, the p-type base regions 113, the p+-type regions 122, and the lower p+-type region portions 123 are provided adjacent to one another sequentially in the depth direction from the front surface of the semiconductor substrate 140, in an entire area between the front surface of the semiconductor substrate 140 and the n−-type drift region 112.

The p++-type contact regions 115, the p-type base regions 113, the p+-type regions 122, and the lower p+-type region portions 123 are each concurrently formed with other p-type regions of the same depth and the same impurity concentration in the active region 101 and surround a periphery of the center portion of the active region 101.

The edge termination region 102 surrounds the periphery of the active region 101. The voltage withstanding structure 130 is provided in the edge termination region 102. The voltage withstanding structure 130, for example, is a spatial modulation JTE structure, which is an improved JTE structure, and is configured by multiple p-type regions 131 and multiple p−-type regions 132 selectively provided between the front surface of the semiconductor substrate 140 and the n−-type drift region 112. All the p-type regions 131 and the p−-type regions 132 are exposed at the front surface of the semiconductor substrate 140 to be in contact with the interlayer insulating film 119 that is on the front surface of the semiconductor substrate 140. Further, between the front surface of the semiconductor substrate 140 and the n−-type drift region 112, an n+-type channel stopper region 133 is selectively provided closer to the chip end than is the voltage withstanding structure 130.

Further, to suppress degradation of the sealing resin due to light generated by pn junctions of a wide band gap semiconductor chip, a known semiconductor device has, between the semiconductor chip and the sealing resin, a functional region that suppresses light having a specific wavelength that degrades the sealing resin, from reaching the sealing resin (for example, refer to Japanese Patent No. 6892997 and International Publication No. WO 2020/136759).

SUMMARY OF THE INVENTION

According to an embodiment of the present invention, a silicon carbide semiconductor device includes: a semiconductor substrate containing silicon carbide and having a first main surface and a second main surface opposite to each other; an active region provided on the semiconductor substrate; a termination region provided on the semiconductor substrate and surrounding a periphery of the active region; a first semiconductor region of a first conductivity type, provided in the semiconductor substrate, spanning the active region and the termination region; a second semiconductor region of a second conductivity type, provided between the first main surface and the first semiconductor region, in the active region; a device structure having a first pn junction between the first semiconductor region and the second semiconductor region, in the active region, a first forward current passing through the first pn junction; a first electrode provided at the first main surface and electrically connected to the second semiconductor region and a second-conductivity-type outer peripheral region; a second electrode provided at the second main surface and electrically connected to the first semiconductor region; and a first protective film selectively provided on the first main surface. The active region includes an outer peripheral portion, provided between the first main surface and the first semiconductor region, the outer peripheral portion constituting the second-conductivity-type outer peripheral region that surrounds a periphery of the device structure, the outer peripheral portion forming a second pn junction with the first semiconductor region, a second forward current passing through the second pn junction. The termination region includes a voltage withstanding structure, provided between the first main surface and the first semiconductor region. The first protective film blocks light generated by the second forward current that passes through the second pn junction.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
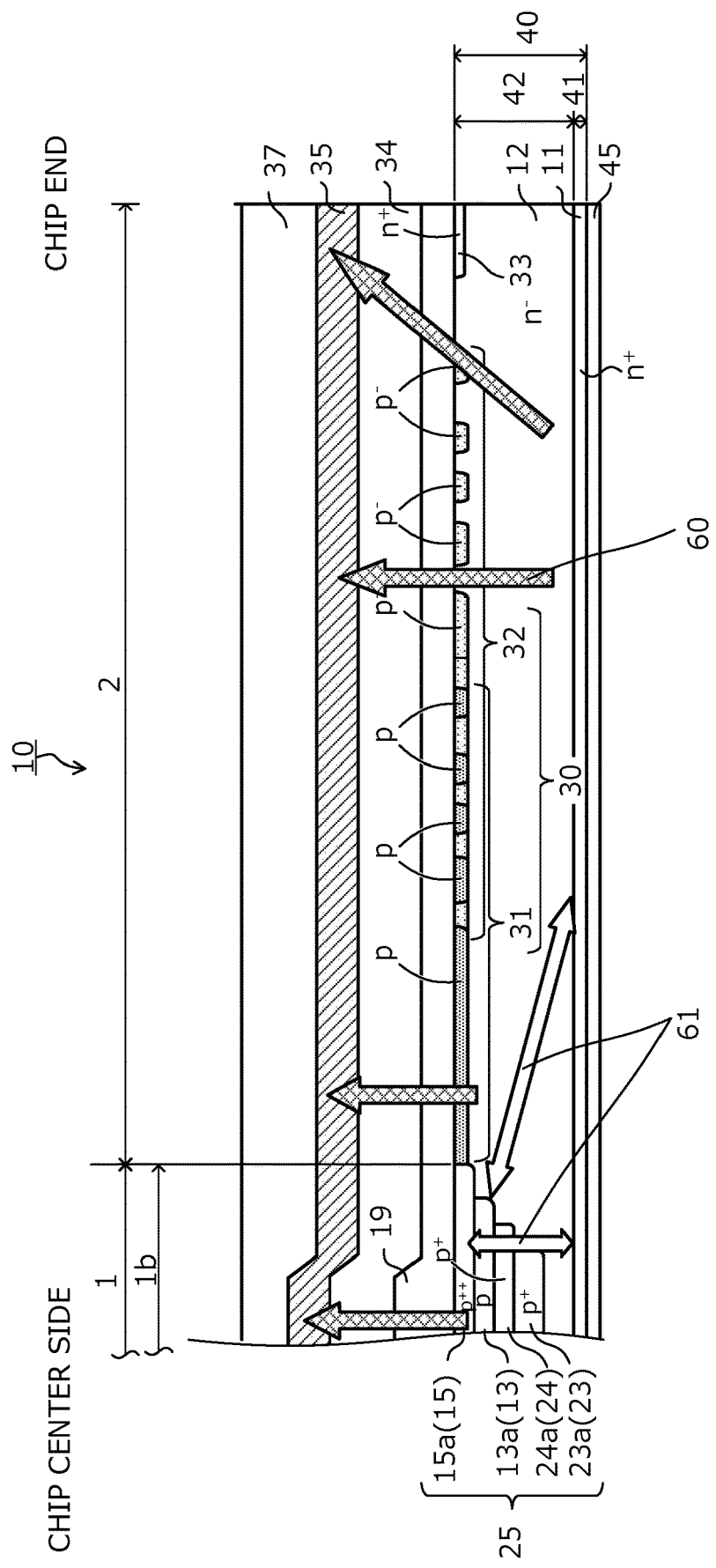
FIG. 1 is a cross-sectional view depicting a structure of an edge termination region of a silicon carbide semiconductor device according to a first embodiment.

First, problems associated with the conventional techniques are discussed. In the MOSFET, normally, while switching is performed by turning the gate electrodes 118 on/off, the MOSFET has built-in diodes 161 formed by pn junctions between n-type regions such as the n−-type drift region 112 and p-type regions such as the p-type base regions 113. When the MOSFET is used as a freewheeling diode (FWD) or a diode and the built-in diodes 161 turn on, blue light 160 is generated by the pn junctions due to recombination of electrons and holes by conductivity modulation as a result of SiC being a direct transitioning semiconductor. Further, a SiC-IGBT operates bipolarly and thus, unlike a MOSFET, normally in the on-state, switching is performed while the blue light 160 is generated by recombination of electrons and holes.

Figure 6:
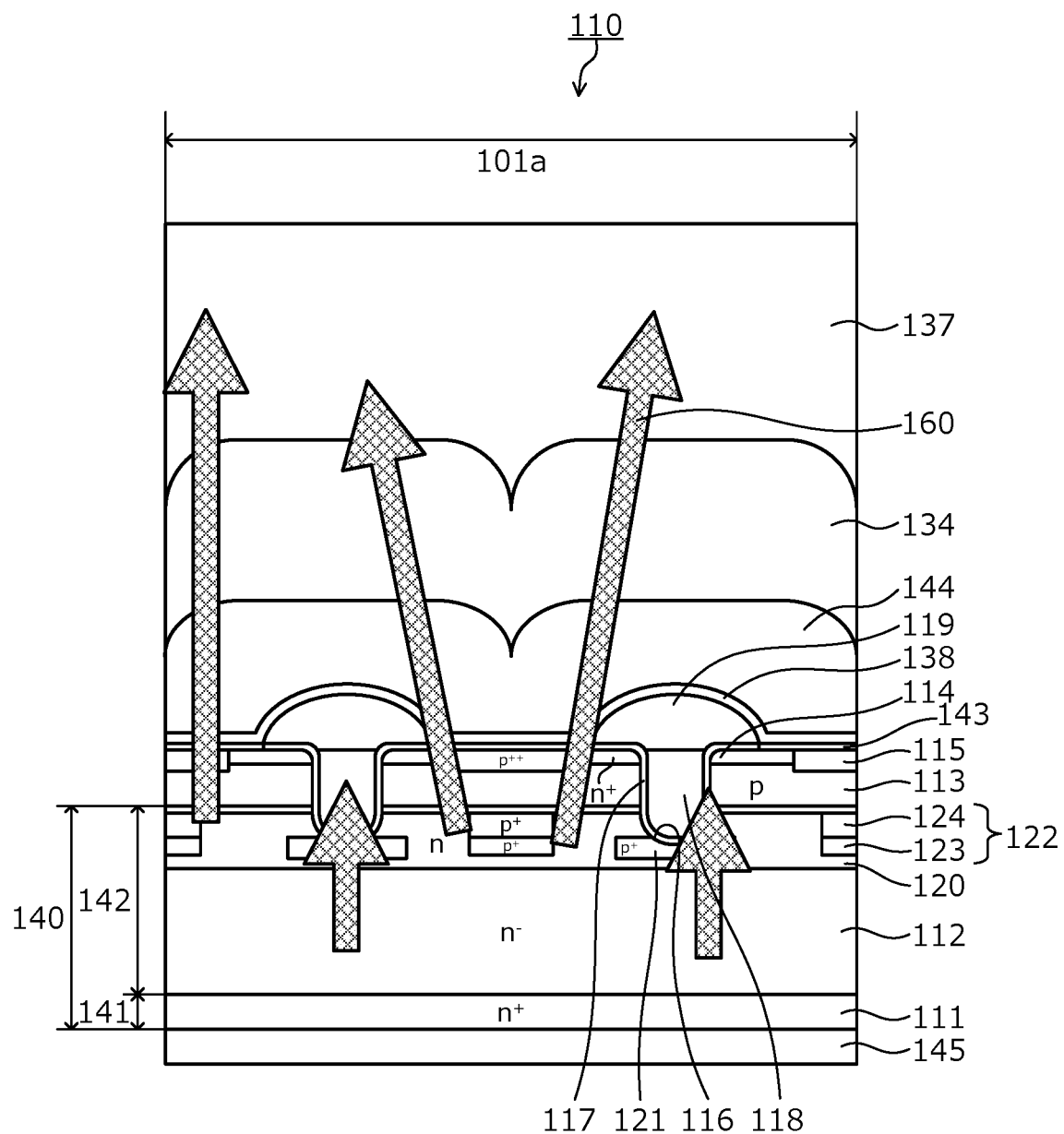
FIG. 6 is a cross-sectional view depicting a structure of an active region of a conventional silicon carbide semiconductor device.
Figure 7:
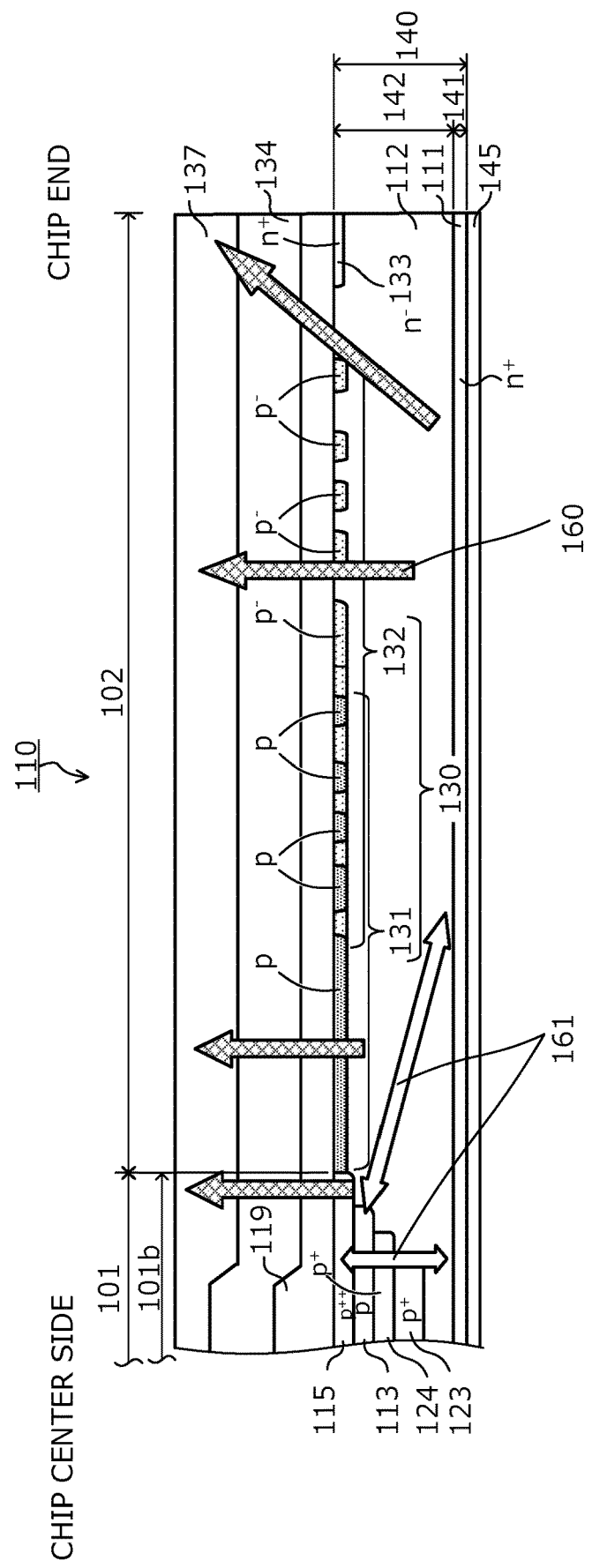
FIG. 7 is a cross-sectional view depicting a structure of an edge termination region the conventional silicon carbide semiconductor device.

Here the protective film 134 such as a polyimide film is translucent and thus, the generated blue light 160 is transmitted through the protective film 134 and reaches the sealing resin 137 (refer to FIGS. 6 and 7). In this instance, the blue light 160 causes degradation of the sealing resin 137, which is a resin, gel, etc., whereby adhesion between the sealing resin 137 and the protective film 134 or the lifespan of the sealing resin 137 is adversely affected. As a result, a problem arises in that film quality of the interlayer insulating film 119, etc. formed therebelow is affected, increases in leakage current and variation of the on-voltage, etc. occur, whereby reliability of the silicon carbide semiconductor device degrades.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A structure of a silicon carbide semiconductor device according to a first embodiment is described. FIG. 1 is a cross-sectional view depicting the structure of an edge termination region of the silicon carbide semiconductor device according to the first embodiment. A silicon carbide semiconductor device 10 according to the first embodiment depicted in FIG. 1 is a vertical MOSFET having a trench structure that, in an edge termination region 2 of a semiconductor substrate (semiconductor chip) 40 that contains silicon carbide (SiC), has a voltage withstanding structure 30.

Figure 4:
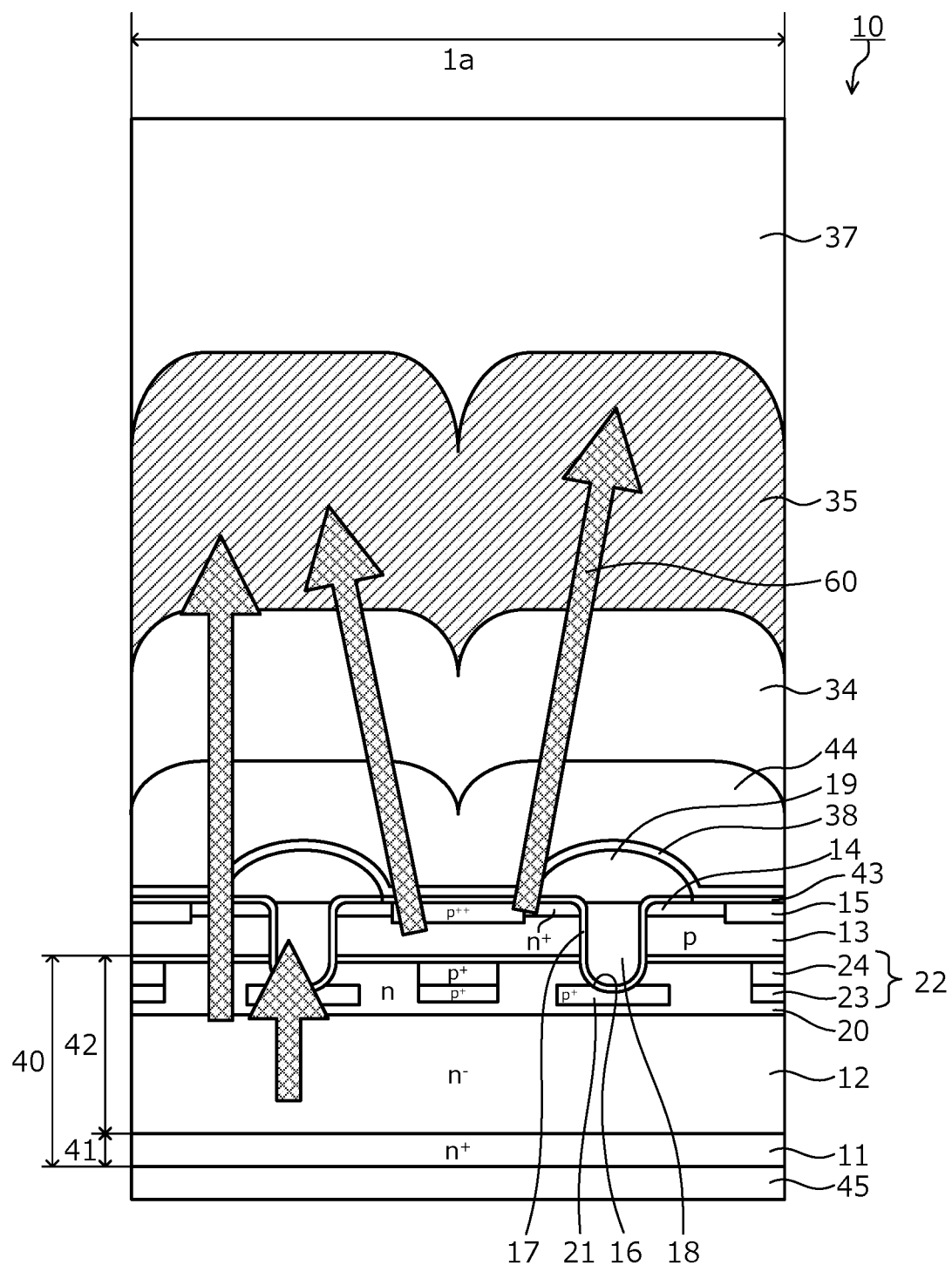
FIG. 4 is a cross-sectional view depicting the structure of the active region of the silicon carbide semiconductor device according to a fourth embodiment.

In the semiconductor substrate 40, multiple unit cells (functional units of the device) each having the same MOSFET structure are disposed adjacent to one another in a center portion 1a of an active region 1 (refer to FIG. 4). The active region 1 is a region through which a main current (drift current) flows when the MOSFET is on. The active region 1 has a substantially rectangular shape in a plan view of the silicon carbide semiconductor device 10 and is disposed in substantially a center (chip center) of the semiconductor substrate 40. The active region 1 is a portion inward (direction to the chip center, from an end (chip end) of the semiconductor substrate 40) from an outer end of a later-described p$^{++}$-type contact extension portion 15a. In the first embodiment, a structure of the center portion 1a of the active region 1 is the same as that of the conventional structure and thus, description thereof is omitted herein (refer to FIG. 6).

The edge termination region 2 is region between the active region 1 and the chip end and surrounds a periphery of the active region 1 in a substantially rectangular shape. In the edge termination region 2, the voltage withstanding structure 30 is provided. The voltage withstanding structure 30 has a function of mitigating electric field close to a border between the active region 1 and the edge termination region 2 and sustains the breakdown voltage. A configuration of the voltage withstanding structure 30 is described hereinafter. The breakdown voltage is a voltage limit at which, even when current between a drain and source increases due to avalanche breakdown occurring at a pn junction, voltage between the drain and source does not further increase.

The semiconductor substrate 40 is formed by epitaxially growing, on a front surface of an n$^+$-type starting substrate 41 containing silicon carbide, an n$^−$-type silicon carbide layer 42 constituting an n$^−$-type drift region (first semiconductor region) 12. The semiconductor substrate 40 has, as a front surface (first main surface), a main surface that has the n$^−$-type silicon carbide layer 42 and has, as a back surface (second main surface), a main surface that has the n$^+$-type starting substrate 41. An entire area of the front surface of the semiconductor substrate 40 is substantially flat and no step occurs between the active region 1 and the edge termination region 2. Substantially flat means a horizontal surface within a range that includes an allowable error due to process variation.

The n$^+$-type starting substrate 41 constitutes an n$^+$-type drain region 111. In the semiconductor substrate 40, the n$^−$-type silicon carbide layer 42 constituting the n$^−$-type drift region 12 is formed in multiple sequential stages by epitaxial growth when regions of the active region 1 are formed. The n$^−$-type drift region 12 is a portion of the n$^−$-type silicon carbide layer 42, free of diffused regions formed by ion implantation and having an impurity concentration left unchanged after the epitaxial growth of the n$^−$-type silicon carbide layer 42. The n$^−$-type drift region 12 is in contact with the n$^+$-type starting substrate 41 and provided spanning the active region 1 to the chip end.

An outer peripheral portion 1b of the active region 1 surrounds the periphery of the center portion 1a of the active region 1 in substantially a rectangular shape. In a longitudinal direction of later-described trenches 16, the outer peripheral portion 1b of the active region 1 is a portion from an outermost end of later-described n$^+$-type source regions 14, to a border between the active region 1 and the edge termination region 2. In a lateral direction of the trenches 16, the outer peripheral portion 1b of the active region 1 is a portion from a center-facing sidewall of an innermost one of the trenches 16 (the center-facing sidewall facing the chip center and innermost one of the trenches 16 being closest to the chip center), to the border between the active region 1 and the edge termination region 2. The outer peripheral portion 1b of the active region 1 is free of unit cells of the MOSFET.

In the outer peripheral portion 1b of the active region 1, the p$^{++}$-type contact extension portion 15a, a p-type base extension portion 13a, a lower p$^+$-type extension portion 23a, and an upper p$^+$-type extension portion 24a are provided sequentially in the depth direction from the front surface of the semiconductor substrate 40, in an entire area between the front surface of the semiconductor substrate 40 and the n$^−$-type drift region 12. These regions are regions extending later-described p$^{++}$-type contact regions 15, a p-type base region 13, lower p$^+$-type region portions 23, and upper p$^+$-type region portions 24 of the center portion 1a of the active region 1, to the outer peripheral portion 1b of the active region 1. A single p-type outer peripheral region (second-conductivity-type outer peripheral region) 25 is configured by these regions (multiple extension portions) in the outer peripheral portion 1b of the active region 1, in an entire area between the front surface of the semiconductor substrate 40 and the n$^−$-type drift region 12. Thus, the outer peripheral portion 1b of the active region 1 includes a built-in diode 61 that include a pn junction (second pn junction) between the p-type outer peripheral region 25 and the n$^−$-type drift region 12.

The p-type outer peripheral region 25 of the outer peripheral portion 1b of the active region 1 surrounds the periphery of the center portion 1a of the active region 1 concentrically. The p-type outer peripheral region 25 is a region for pulling out hole current to a later-described source electrode 44 (the hole current flowing to the active region 1 and generated by the n$^−$-type drift region 12 of the edge termination region 2 when the MOSFET (the silicon carbide semiconductor device is off); the p-type outer peripheral region 25 is electrically connected to the source electrode 44. When the MOSFET is off, the hole current generated by the n$^-$-type drift region 12 of the edge termination region 2 is pulled out to the source electrode 44 via the p-type outer peripheral region 25, whereby concentration of hole current during avalanche breakdown in the edge termination region 2 is suppressed.

The voltage withstanding structure 30 of the edge termination region 2, for example, is a spatial modulation JTE structure having a JTE structure as a modulation structure and is configured by multiple p-type regions 31 and multiple p$^-$-type regions 32 selectively provided between the front surface of the semiconductor substrate 40 and the n$^-$-type drift region 12. The p-type regions 31 and the p$^-$-type regions 32 are diffused regions formed in the n$^-$-type silicon carbide layer 42, at the surface thereof, by ion implantation.

The p-type regions 31 are disposed apart from one another concentrically surrounding the periphery of the active region 1. In a direction from the chip center to the chip end, the p-type regions 31 are disposed in descending order of width (width in the direction of the normal from the chip center side to the chip end) and an interval between any one of the p-type regions 31 and an adjacent one of the p-type regions 31 (the adjacent one closer to the chip center) is relatively wide. An innermost one of the p-type regions 31 is disposed adjacent to the p$^{++}$-type contact extension portion 15a, closer to the chip end than is the p$^{++}$-type contact extension portion 15a.

The p$^-$-type regions 32 are disposed apart from one another concentrically surrounding the periphery of the active region 1. The p$^-$-type regions 32 are disposed in descending order of width (width in the direction of the normal) in the direction from the chip center to the chip end and an interval between any one of the p$^-$-type regions 32 and an adjacent one of the p$^-$-type regions 32 (the adjacent one of the p$^-$-type regions 32 closer to the chip center) is wide. The width of an outermost of the p$^-$-type regions 32 may be wider than the width of the adjacent one (closer to the chip center) of the p$^-$-type regions 32. An innermost one of the p$^-$-type regions 32 is disposed so that portions thereof are between all the p-type regions 31, which are adjacent to one another, whereby the portions are adjacent to the p-type regions 31 on both sides thereof in the direction of the normal and corner portions of the bottoms of all the p-type regions 31 are surrounded.

An inner end of the innermost one the p$^-$-type regions 32 terminates at the same position as an inner end portion of the innermost one of the p-type regions 31 or terminates closer to the chip end than is the inner end portion of the innermost one of the p-type regions 31. The innermost one of the p$^-$-type regions 32 extends closer to the chip end than is an outermost one of the p-type regions 31. The p$^-$-type regions 32 other than the innermost one of the p$^-$-type regions 32 are disposed closer to the chip end than are the p-type regions 31. The n$^-$-type drift region 12 extends between all the p$^-$-type regions 32, which are adjacent to one another, reaches the front surface of the semiconductor substrate 40, and is adjacent to the p$^-$-type regions 32 on both sides thereof in the direction of the normal.

Further, between the front surface of the semiconductor substrate 40 and the n$^-$-type drift region 12, an n$^+$-type channel stopper region 33 is selectively provided closer to the chip end than is the voltage withstanding structure 3. The n$^+$-type channel stopper region 33 is a diffused region formed in the n$^-$-type silicon carbide layer 42, at the surface thereof, by ion implantation. The n$^+$-type channel stopper region 33 is provided closer to the chip end than is the voltage withstanding structure 30, is apart from the voltage withstanding structure 30 in the direction of the normal, and surrounds a periphery of the voltage withstanding structure 30. The n$^+$-type channel stopper region 33 is in contact with an interlayer insulating film 19 on the front surface of the semiconductor substrate 40.

The n$^+$-type channel stopper region 33 is exposed at the chip end. Between the n$^+$-type channel stopper region 33 and the voltage withstanding structure 30 (outermost one of the p$^-$-type regions 32) is the n$^-$-type drift region 12. The n$^+$-type channel stopper region 33 has a floating potential. The front surface of the semiconductor substrate 40 in the edge termination region 2 is free of a field plate (FP) and a channel stopper electrode. Instead of the n$^+$-type channel stopper region 33, a p$^+$-type channel stopper region may be provided.

In the outer peripheral portion 1b of the active region 1 and in the edge termination region 2, an entire area of the front surface of the semiconductor substrate 40 is covered by the interlayer insulating film 19 (second protective film). Further, to prevent diffusion of ions into the semiconductor device and to insulate the semiconductor device, in an entire area of the surface of the interlayer insulating film 19, a polyimide film is formed as a translucent protective film 34 (second protective film). Here, translucent means, at least the blue light 60 is not completely blocked and all or a portion of the blue light 60 is transmitted.

The silicon carbide semiconductor device 10 of the first embodiment has the built-in diode 61 formed by the pn junction between an n-type region such as the n$^-$-type drift region 12 and a p-type region such as the p-type base region 13. The built-in diode 61, as depicted in FIG. 1, is present between the edge termination region 2 and the outer peripheral portion 1b of the active region 1. Thus, when forward current flows through the built-in diode 61, in the outer peripheral portion 1b of the active region 1 and the edge termination region 2, electrons and holes recombine, the blue light 60 (includes ultraviolet light, which has a shorter wavelength than blue light) is generated by the pn junction. To block the blue light 60, in the first embodiment, an entire area on the translucent protective film 34 is covered by an opaque protective film 35 (first protective film). Here, opaque means not transparent with respect to the blue light 60, that is, blocks, does not transmit the blue light 60. For example, the opaque protective film 35 is a black protective film, is an organic black polyimide film. Black means not transparent with respect to visible light that includes the blue light.

Further, in the first embodiment, the opaque protective film 35 is provided only in the outer peripheral portion 1b of the active region 1 and the edge termination region 2. The source electrode 44 containing an Al alloy is provided in the center portion 1a of the active region 1 because leakage of the blue light 60 low and the blue light 60 mainly leaks from the outer peripheral portion 1b of the active region 1 and the edge termination region 2.

The silicon carbide semiconductor device has a case (not depicted) filled with a sealing resin 37 to insulate and protect the semiconductor chip. In the first embodiment, the sealing resin 37 is in contact with the opaque protective film 35. The sealing resin 37 may contain a thermosetting resin composition and in particular, preferably, may contain thermosetting resin composition with high heat resistance. The thermosetting resin composition contains a thermosetting resin base agent and optionally, may contain an inorganic filler, a curing agent, a curing accelerant, and necessary additives.

In this manner, the opaque protective film 35 is provided in the outer peripheral portion 1b of the active region 1 and the edge termination region 2, whereby the blue light 60 is blocked by the opaque protective film 35, the blue light 60 being generated by the pn junction as a result of the recombination of electrons and holes caused by forward current passing through the built-in diode 61. Thus, the blue light 60 does not reach the sealing resin 37, thereby, enabling suppression of degradation of the resin, gel of the sealing resin 37. Therefore, adhesion between the sealing resin 37 and the opaque protective film 35 is favorable, degradation of the film quality of the interlayer insulating film 19, etc. is eliminated and reliability of the silicon carbide semiconductor device is increased.

Next, a method of manufacturing the silicon carbide semiconductor device according to the first embodiment is described. First, similarly to the method of manufacturing a silicon carbide semiconductor device by the conventional technique, surface structures are formed on the semiconductor substrate 40. In the semiconductor substrate 40, the MOS structure of the active region 1 and the voltage withstanding structure 30 of the edge termination region 2, etc. are formed. Next, the interlayer insulating film 19 is formed at the front surface of the semiconductor substrate 40. Next, an opening is formed in the interlayer insulating film 19 in the center portion 1a of the active region 1; the barrier metal 38 (refer to FIG. 4) and the source electrode 44 are formed in the active region 1.

Next, the translucent protective film 34 is selectively formed by a polyimide film on the source electrode 44 in the center portion 1a of the active region 1, and on the interlayer insulating film 19 in the outer peripheral portion 1b of the active region 1 and the edge termination region 2. Next, the opaque protective film 35 is formed in a region on the translucent protective film 34 in the outer peripheral portion 1b of the active region 1 and the edge termination region 2.

The opaque protective film 35, for example, is formed by an organic black polyimide film. The black polyimide film may be formed by injecting oxygen ($O_2$) during polyimide application. Further, the black polyimide film may be formed by a curing temperature of 400 degrees C. or higher after the polyimide application. Further, in case of a photosensitive film without injection of oxygen, the black polyimide film, may be created having a thickness of 15 μm or more.

Next, nickel and/or titanium (Ti) is deposited in an entire area of the back surface of the semiconductor substrate 40, thereafter a drain electrode 45 is formed by annealing. Next, in the center portion 1a of the active region 1, the translucent protective film 34 is selectively removed. A portion of the translucent protective film 34 exposed in the opening constitutes the source pad. Next, semiconductor substrate is diced (cut) into individual chips.

Next, the silicon carbide semiconductor device is assembled. A method of assembly is the same as a method of assembly by a conventional technique. For example, first, the semiconductor chip is mounted on a stacked substrate; the semiconductor chip and an electrode pattern provided on an insulated substrate are electrically connected by lead frame wiring via soldering. Next, these are bonded to a metal substrate and a resin case is adhered by a silicon-based adhesive. Next, the semiconductor chip and a metal terminal are connected by a metal wire and the resin case is filled with the sealing resin 37 such as a hard resin like an epoxy resin. As a result, the silicon carbide semiconductor device according to the first embodiment is completed.

As described above, according to the silicon carbide semiconductor device of the first embodiment, the opaque protective film is provided in the outer peripheral portion of the active region and the edge termination region. As a result, the blue light, which is generated by the pn junction when forward current passes through the built-in diodes thereby causing recombination of electrons and holes, is blocked by the opaque protective film. Thus, the blue light does not reach the sealing resin, degradation of the resin, gel of the sealing resin may be suppressed, the adhesion between the sealing resin and the opaque protective film is favorable, and the reliability of the semiconductor device may be increased without degradation in the film quality characteristics of the interlayer insulating film, etc.

Figure 2:
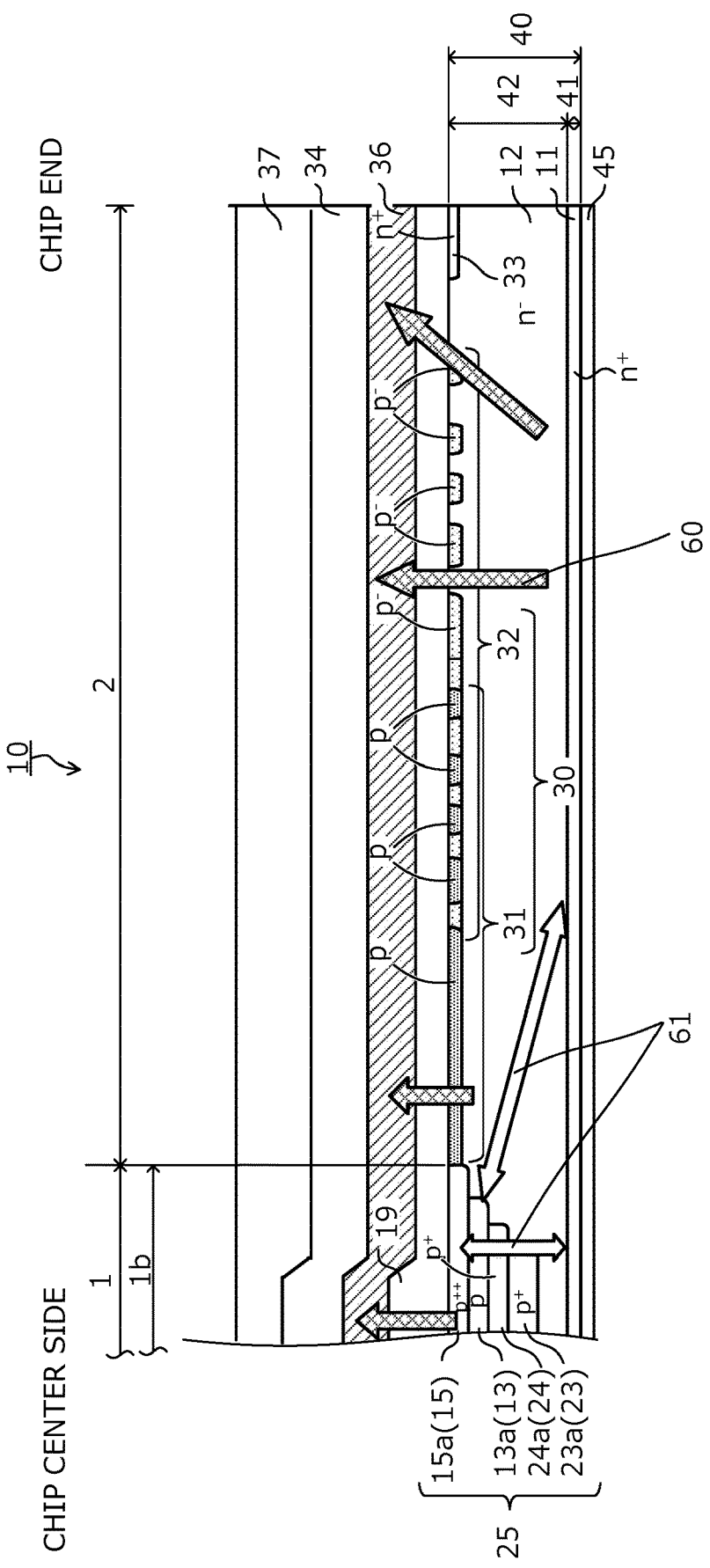
FIG. 2 is a cross-sectional view depicting the structure of the edge termination region of the silicon carbide semiconductor device according to a second embodiment.

Next, the structure of the silicon carbide semiconductor device according to a second embodiment is described. FIG. 2 is a cross-sectional view depicting the structure of the edge termination region of the silicon carbide semiconductor device according to the second embodiment. The silicon carbide semiconductor device 10 according to the second embodiment differs from the silicon carbide semiconductor device 10 according to the first embodiment in that an entire region on the interlayer insulating film 19 is covered by an opaque polysilicon film 36.

In the second embodiment, the entire region on the opaque polysilicon film 36 is covered by the translucent protective film 34 and the translucent protective film 34 is in contact with the sealing resin 37. In the second embodiment as well, the opaque polysilicon film 36 is provided only in the outer peripheral portion 1b of the active region 1 and the edge termination region 2. The opaque polysilicon film 36 of the second embodiment, for example, is an inorganic non-doped polysilicon film. The higher is the resistance of the non-doped polysilicon film, the better and thus, completely non-doped is unnecessary and a net impurity concentration suffices to be $1\times10^{15}/cm^3$ or less.

As described, in the second embodiment as well, the opaque polysilicon film 36 is provided in the outer peripheral portion 1b of the active region 1 and the edge termination region 2. As a result, similarly to the first embodiment, the blue light 60 is blocked by the opaque polysilicon film 36 and does not reach the sealing resin 37, whereby degradation of the resin, gel of the sealing resin 37 may be suppressed. Thus, adhesion between the sealing resin 37 and the opaque protective film 35 is favorable, and the reliability of the semiconductor device may be further increased without degradation in the film quality characteristics of the interlayer insulating film 19, etc.

Next, a method of manufacturing the silicon carbide semiconductor device according to the second embodiment is described. Similar to the first embodiment, in the semiconductor substrate 40, the MOS structure of the active region 1 and the voltage withstanding structure 30 of the edge termination region 2, etc. are formed. Next, the interlayer insulating film 19 is formed at the front surface of the semiconductor substrate 40. Next, an opening is formed in the interlayer insulating film 19 in the center portion 1a of the active region 1; the barrier metal 38 and the source electrode 44 are formed in the active region 1.

Next, the opaque polysilicon film 36 is formed on the outer peripheral portion 1b of the active region 1 and the interlayer insulating film 19 in the edge termination region 2. The opaque polysilicon film 36 may be formed by depositing a non-doped polysilicon by chemical vapor deposition (CVD) at a temperature of 400 degrees C. or less.

Next, the translucent protective film 34 is selectively formed by a polyimide film on the source electrode 44 in the center portion 1a of the active region 1 and on the opaque polysilicon film 36 in the outer peripheral portion 1b of the active region 1 and the edge termination region 2. Thereafter, the same processes as those of the first embodiment are performed, whereby the silicon carbide semiconductor device according to the second embodiment may be manufactured.

As described, according to the silicon carbide semiconductor device of the second embodiment, the opaque polysilicon film is provided in the outer peripheral portion of the active region and the edge termination region. As a result, the blue light that is generated by the pn junction when forward current passes through the built-in diodes thereby causing recombination of electrons and holes is blocked by the opaque polysilicon film. Thus, the second embodiment has effects similar to those of the first embodiment.

Figure 3:
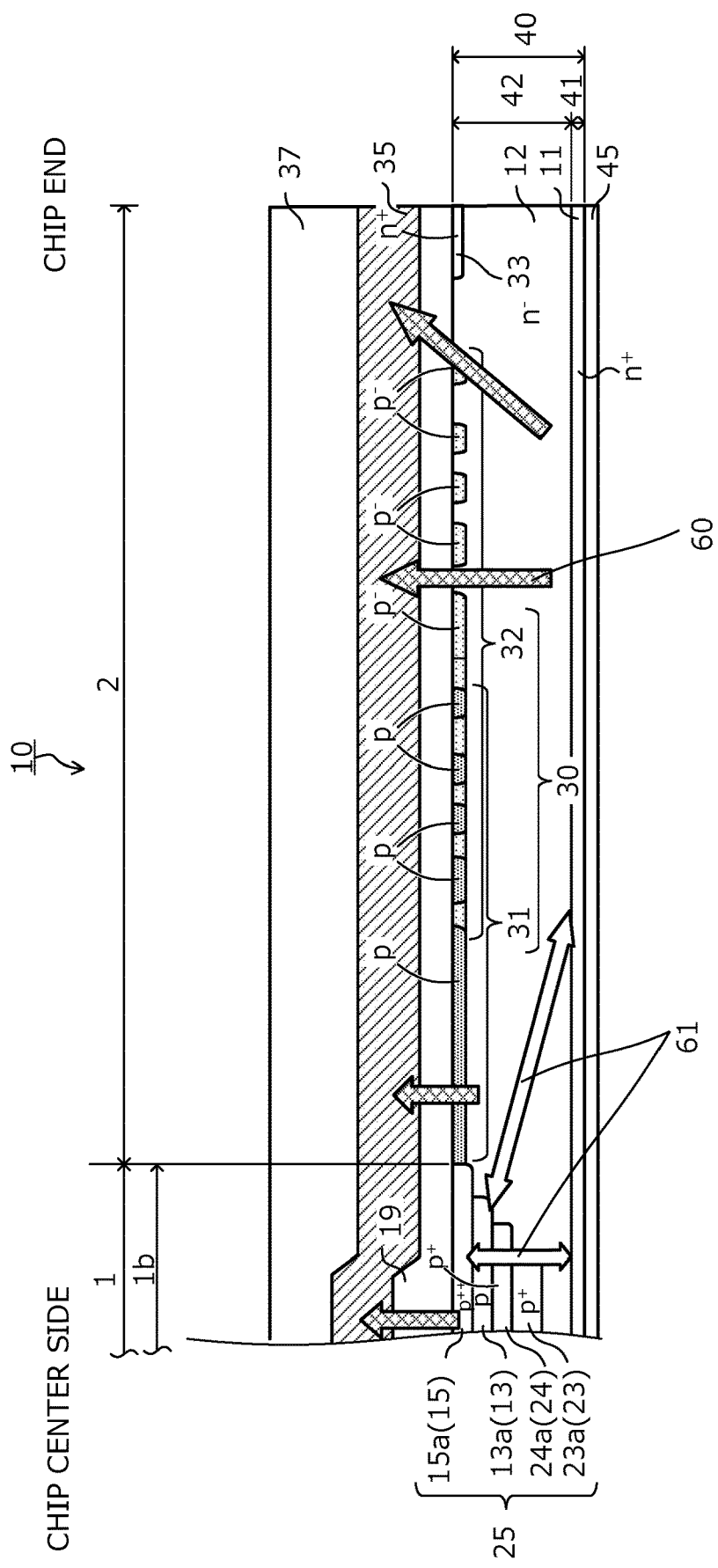
FIG. 3 is a cross-sectional view depicting the structure of the edge termination region of the silicon carbide semiconductor device according to a third embodiment.

Next, the structure of the silicon carbide semiconductor device according to a third embodiment is described. FIG. 3 is a cross-sectional view depicting the structure of the edge termination region of the silicon carbide semiconductor device according to the third embodiment. The silicon carbide semiconductor device 10 according to the third embodiment depicted in FIG. 3 differs from the silicon carbide semiconductor device 10 according to the first embodiment in that an entire region on the interlayer insulating film 19 is covered by only the opaque protective film 35 and is free of the translucent protective film 34, that is, the translucent protective film 34 is omitted.

In the third embodiment, the opaque protective film 35 is in contact with the sealing resin 37. In the third embodiment as well, the opaque protective film 35 is provided only in the outer peripheral portion 1b of the active region 1 and the edge termination region 2. The opaque protective film 35 of the third embodiment, for example, similarly to the opaque protective film 35 of the first embodiment, is a black protective film, an organic black polyimide film.

As described, in the third embodiment as well, the opaque protective film 35 is provided in the outer peripheral portion 1b of the active region 1 and the edge termination region 2. As a result, similarly to the first embodiment, the blue light 60 is blocked by the opaque protective film 35 and does not reach the sealing resin 37; and degradation of the resin, gel of the sealing resin 37 may be suppressed. Thus, adhesion between the sealing resin 37 and the opaque protective film 35 is favorable, and the reliability of the semiconductor device may be further increased without degradation of the film quality characteristics of the interlayer insulating film 19, etc.

Next, a method of manufacturing the silicon carbide semiconductor device according to the third embodiment is described. Similar to the first embodiment, in the semiconductor substrate 40, the MOS structure of the active region 1 and the voltage withstanding structure 30 of the edge termination region 2, etc. are formed. Next, the interlayer insulating film 19 is formed at the front surface of the semiconductor substrate 40. Next, an opening is formed in the interlayer insulating film 19 in the center portion 1a of the active region 1; and the barrier metal 38 and the source electrode 44 are formed in the active region 1.

Next, the translucent protective film 34 is selectively formed by a polyimide film on the source electrode 44 in the center portion 1a of the active region 1. Next, the opaque protective film 35 is formed in the entire region on the interlayer insulating film 19 in the outer peripheral portion 1b of the active region 1 and the edge termination region 2. The opaque protective film 35 may be formed by the same method as that of the first embodiment. Thereafter, the same processes as those of the first embodiment are performed, whereby the silicon carbide semiconductor device according to the third embodiment may be manufactured.

As described above, according to the silicon carbide semiconductor device of the third embodiment, the opaque protective film is provided in the outer peripheral portion of the active region and the edge termination region. As a result, the blue light that is generated by the pn junction when forward current passes through the built-in diodes thereby causing recombination of electrons and holes, is blocked by the opaque protective film. Thus, the second embodiment has effects similar to those of the first embodiment.

The structure of the silicon carbide semiconductor device according to a fourth embodiment is described. FIG. 4 is a cross-sectional view depicting the structure of the active region of the silicon carbide semiconductor device according to the fourth embodiment. The silicon carbide semiconductor device 10 according to the fourth embodiment depicted in FIG. 4 is a vertical MOSFET with the trench structure that has the voltage withstanding structure 30 in the edge termination region 2 of the semiconductor substrate (semiconductor chip) 40 that contains silicon carbide (SiC).

FIG. 4 depicts the structure of the center portion 1a of the active region 1 of the fourth embodiment. In the fourth embodiment, the structure of the outer peripheral portion 1b of the active region 1 and the edge termination region 2 is the same as that of the first embodiment and thus, description thereof is omitted hereinafter (refer to FIG. 1).

The trench structure is provided in the center portion 1a of the active region 1 of the fourth embodiment. The trench structure is configured by the p-type base region (second semiconductor region) 13, the $n^+$-type source regions 14, the $p^{++}$-type contact regions 15, the trenches 16, gate insulating films 17, and gate electrodes 18. The p-type base region 13, the $n^+$-type source regions 14, and the $p^{++}$-type contact regions 15 are diffused regions formed in the $n^-$-type silicon carbide layer 42 by ion implantation. The p-type base region 13 is provided in an entire area between the front surface of the semiconductor substrate 40 and the $n^-$-type drift region 12 in the center portion 1a of the active region 1; the p-type base region 13 extends toward the chip end and terminates in the outer peripheral portion 1b of the active region 1. Thus, the center portion 1a of the active region 1 includes the built-in diode (not depicted) that includes a pn junction (first pn junction) between the p-type region (the p-type base region 13) and the $n^-$-type drift region 12.

The $n^+$-type source regions 14 and the $p^{++}$-type contact regions 15 are each selectively provided between the front surface of the semiconductor substrate 40 and the p-type base region 13, and have bottoms (lower surfaces: ends facing the back surface of the semiconductor substrate 40) that are in contact with the p-type base region 13. Only in the center portion 1a of the active region 1, the $n^+$-type source regions 14 are provided in contact with the $p^{++}$-type contact regions 15 of the center portion 1a of the active region 1. The $n^+$-type source regions 14 and the $p^{++}$-type contact regions 15 have upper surfaces (ends facing the front surface of the semiconductor substrate 40) that are in ohmic contact with ohmic electrodes 43.

Between the $n^-$-type drift region 12 and the p-type base region 13, an n-type current spreading region 20 and $p^+$-type regions 21, 22 are each selectively provided at depth positions closer to the $n^+$-type drain region 11 (back surface of the semiconductor substrate 40) than are bottoms of the trenches 16. The n-type current spreading region 20 and the $p^+$-type regions 21, 22 are diffused regions formed in the n⁻-type silicon carbide layer 42 by ion implantation. The n-type current spreading region 20 may reach depth positions closer to the n⁺-type drain region 11 than are the p⁺-type regions 21, 22.

The n-type current spreading region 20 is a so-called current spreading layer (CSL) that reduces carrier spreading resistance. The n-type current spreading region 20 is provided between and in contact with all adjacent two of the p⁺-type regions 21, 22; the n-type current spreading region 20 extends in a direction parallel to the front surface of the semiconductor substrate 40, reaches the trenches 16 and is in contact with the gate insulating films 17. The n-type current spreading region 20, at an upper surfaces thereof, is in contact with the p-type base region 13 and at a lower surface, is in contact with the n⁻-type drift region 12.

The n-type current spreading region 20 may be omitted. In an instance in which the n-type current spreading region 20 is omitted, instead of the n-type current spreading region 20, the n⁻-type drift region 12 reaches the p-type base region 13, is in contact with the p-type base region 13 and the p⁺-type regions 21, 22, extends in a direction parallel to the front surface of the semiconductor substrate 40, reaches the trenches 16, and is in contact with the gate insulating films 17.

The p⁺-type regions 21, 22 are fixed to the potential of the later-described source electrode 44 and have a function of mitigating electric field applied to the gate insulating films 17 by depleting (or causing the n-type current spreading region 20 to deplete, or both) when the MOSFET (the silicon carbide semiconductor device 10) is off. The p⁺-type regions 21 are provided apart from the p-type base region 13 and face the bottoms of the trenches 16 in the depth direction. The p⁺-type regions 21 are partially connected to the p⁺-type regions 22 by non-depicted portions and are thereby electrically connected to the source electrode 44.

The p⁺-type regions 21 may be in contact with the gate insulating films 17 at the bottoms of the trenches 1 or may be apart from the bottoms of the trenches 16. A width of each of the p⁺-type regions 21 is the same as a width of each of the trenches 16 or is wider than the width of each of the trenches 16. When the width of the p⁺-type regions 21 is wider than the width of the trenches 16, the p⁺-type regions 21 further face corner portions (borders between sidewalls and the bottom) of the bottoms of the trenches 16 in the depth direction. As a result, the effect of mitigating electric field near the bottoms of the trenches 16 by the p⁺-type regions 21 is further increased.

The p⁺-type regions 22 are provided between the trenches 16, which are adjacent to one another, and are apart from the p⁺-type regions 21 and the trenches 16. The p⁺-type regions 22, at upper surfaces thereof, are in contact with the p-type base region 13 and are electrically connected to the source electrode 44 via the p-type base region 13. Each of the p⁺-type regions 22 is formed by an upper portion (portion facing the n⁺-type source regions 14) 24 formed in the n⁻-type silicon carbide layer 42 and a lower portion (portion facing the n⁺-type drain region 11) 23 formed in the n⁻-type silicon carbide layer 42a, the upper portion 24 and the lower portion 23 being adjacent to each other in the depth direction.

The trenches 16 penetrate through the n⁺-type source regions 14 and the p-type base region 13 in the depth direction and reach the n-type current spreading region 20 (in an instance in which the n-type current spreading region 20 is omitted, the n⁻-type drift region 12). The trenches 16 may terminate in the p⁺-type regions 21. The trenches 16, for example, extend in a striped pattern in a direction parallel to the front surface of the semiconductor substrate 40 and reach the outer peripheral portion 1b of the active region 1. In the trenches 16, the gate electrodes 18 are provided, respectively, via the gate insulating films 17.

The interlayer insulating film 19 is provided in an entire area of the front surface of the semiconductor substrate 40 and covers the gate electrodes 18. The ohmic electrodes (first electrode) 43 are provided on portions of the front surface of the semiconductor substrate 40 exposed in contact holes of the interlayer insulating film 19. The ohmic electrodes 43 are in ohmic contact with the n⁺-type source regions 14 and the p⁺⁺-type contact regions 15 (in an instance in which the p⁺⁺-type contact regions 15 are omitted, the p-type base region 13) at the front surface of the semiconductor substrate 40, in the contact holes of the interlayer insulating film 19. The ohmic electrodes 43 are, for example, a nickel silicide (NixSiy, where x and y are arbitrary integers) film.

The source electrode (first electrode) 44 is provided on the interlayer insulating film 19 so as to be embedded in the contact holes of the interlayer insulating film 19. The source electrode 44 is provided in substantially an entire area of the center portion 1a of the active region 1 and is electrically connected to the n⁺-type source regions 14, the p⁺⁺-type contact regions 15, the p-type base region 13, and the p⁺-type regions 21, 22, via the ohmic electrodes 43.

On the ohmic electrodes 43 and the interlayer insulating film 19, the barrier metal 38 that prevents diffusion of metal atoms to the gate electrodes 18 may be provided. The barrier metal 38, for example, contains titanium (Ti) or titanium nitride (TiN). The barrier metal 38 may have a two-layer structure of titanium (Ti) and titanium nitride (TiN). In this instance, the source electrode 44 is provided on the barrier metal 38.

Further, to prevent diffusion of ions into the semiconductor device and to insulate and protect the semiconductor device, the translucent protective film 34 is deposited on the interlayer insulating film 19 in the edge termination region 2 and on the source electrode 44 in the active region 1. In the fourth embodiment, the opaque protective film 35 is provided in the entire region on the translucent protective film 34 in the center portion 1a of the active region 1, the outer peripheral portion 1b of the active region 1, and the edge termination region 2. The opaque protective film 35 of the fourth embodiment is a same films as that of the opaque protective film 35 of the first embodiment.

An opening (not depicted) is provided in the protective films 34, 35 and a portion of the source electrode 44 exposed in the opening of the protective films 34, 35 constitutes the source pad. FIG. 4 depicts a portion free of the opening. In the center portion 1a of the active region 1, while the source electrode 44 containing an Al alloy is provided, the source electrode 44 is not provided in all the regions and there are regions that are free of the source electrode 44. In these regions, there is leakage of the blue light 60 and therefore, in the fourth embodiment, the opaque protective film 35 is further deposited in the center portion 1a of the active region 1.

The opaque protective film 35 of the center portion 1a of the active region 1 may be a same film as that of the outer peripheral portion 1b of the active region 1 and the opaque protective film 35 of the edge termination region 2 and may be thinner. In the center portion 1a of the active region 1, the source pad is provided and therefore, at least blocking of the blue light 60 suffices.

As described, the opaque protective film 35 is further provided in the center portion 1a of the active region 1, whereby even in the center portion 1a of the active region 1, the blue light 60 is blocked by the opaque protective film 35. As a result, the blue light 60 does not reach the sealing resin 37 and degradation of the resin, gel of the sealing resin 37 may be further suppressed as compared to the first embodiment. Thus, adhesion between the sealing resin 37 and the opaque protective film 35 is favorable, and the reliability of the semiconductor device may be further increased without degradation of the film quality characteristics of the interlayer insulating film 19, etc.

The drain electrode (second electrode) 45 is provided in an entire area of the back surface (back surface of the $n^+$-type starting substrate 41) of the semiconductor substrate 40, is in ohmic contact with the $n^+$-type drain region 11 (the $n^+$-type starting substrate 41), and is electrically connected to the $n^+$-type drain region 11.

Next, a method of manufacturing the silicon carbide semiconductor device according to fourth embodiment is described. First, similarly to a method of manufacturing a silicon carbide semiconductor device by the conventional technique, in the semiconductor substrate 40, the MOS structure of the active region 1 and the voltage withstanding structure 30 of the edge termination region 2, etc. are formed. Next, the interlayer insulating film 19 is formed at the front surface of the semiconductor substrate 40. Next, an opening is formed in the interlayer insulating film 19 in the center portion 1a of the active region 1; the barrier metal 38 and the source electrode 44 are formed in the active region 1.

Next, the translucent protective film 34 is selectively formed by a polyimide film on the source electrode 44 in the center portion 1a of the active region 1 and on the interlayer insulating film 19 in the outer peripheral portion 1b of the active region 1 and the edge termination region 2. Next, the opaque protective film 35 is formed in an entire region on the translucent protective film 34 in the center portion 1a of the active region 1, the outer peripheral portion 1b of the active region 1, and the edge termination region 2. The opaque protective film 35 may be formed by the same method as that of the opaque protective film 35 of the first embodiment.

Next, nickel and/or titanium (Ti) is deposited in an entire area of the back surface of the semiconductor substrate 40 and thereafter, the drain electrode 45 is formed by annealing. Next, in the center portion 1a of the active region 1, the translucent protective film 34 and the opaque protective film 35 are selectively removed. A portion exposed in the opening of the protective films 34, 35 constitutes the source pad. Thereafter, the same processes as those of the first embodiment are performed, whereby the silicon carbide semiconductor device according to the fourth embodiment may be manufactured.

As described above, according to the silicon carbide semiconductor device of the fourth embodiment, the opaque protective film is provided in the center portion of the active region, the outer peripheral portion of the active region, and the edge termination region. As a result, even in the center portion of the active region, the blue light is blocked by the opaque protective film. Thus, the blue light does not reach the sealing resin, degradation of the resin, gel of the sealing resin may be further suppressed as compared to the first embodiment, the adhesion between the sealing resin and the opaque protective film is favorable, and the reliability of the semiconductor device may be further increased without degradation in the characteristics of the film quality of the interlayer insulating film, etc.

Figure 5:
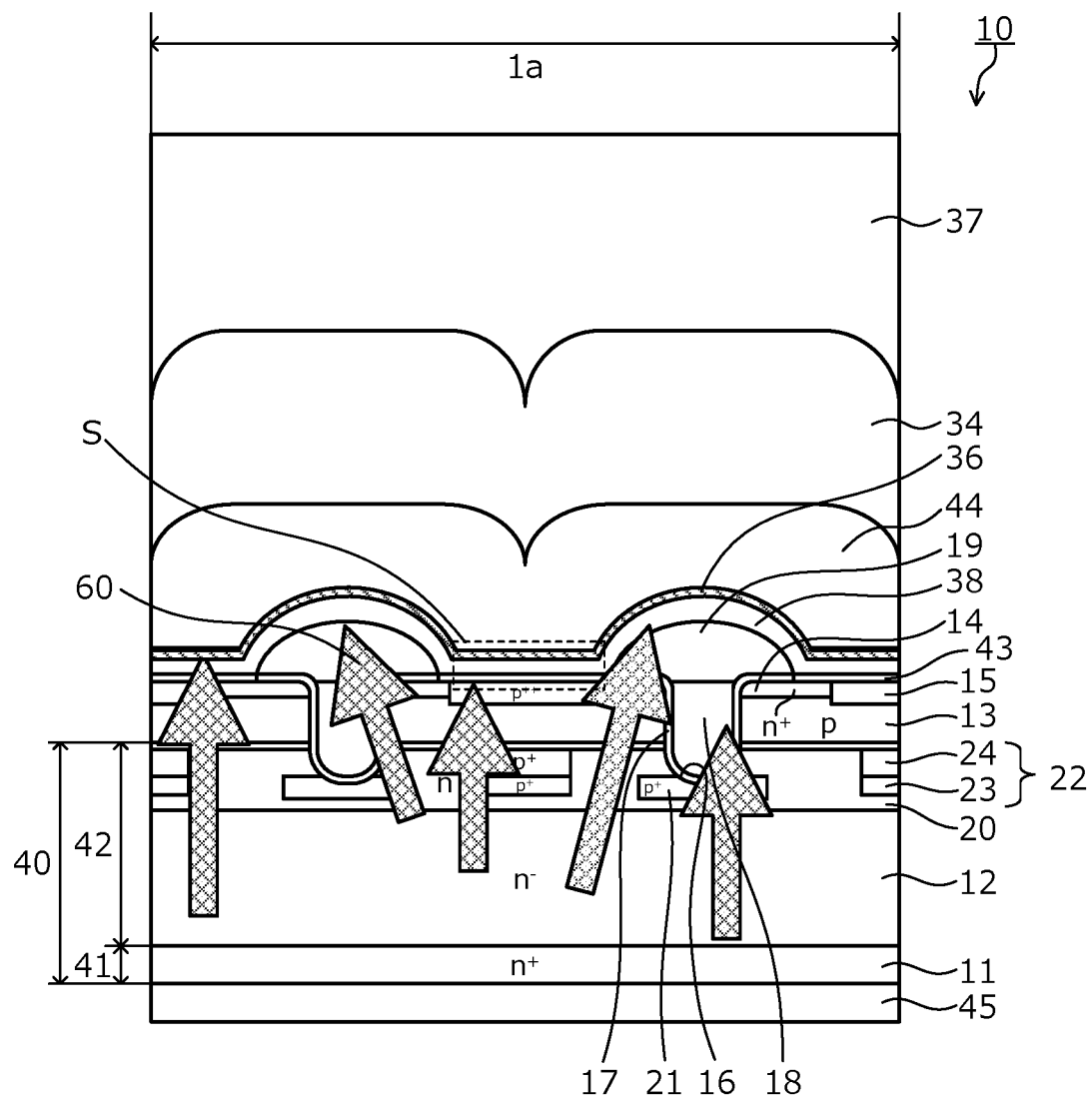
FIG. 5 is a cross-sectional view depicting the structure of the active region of the silicon carbide semiconductor device according to a fifth embodiment.

Next, the structure of the silicon carbide semiconductor device according to a fifth embodiment is described. FIG. 5 is a cross-sectional view depicting the structure of the active region of the silicon carbide semiconductor device according to the fifth embodiment. The silicon carbide semiconductor device 10 according to the fifth embodiment depicted in FIG. 5 differs from the silicon carbide semiconductor device 10 according to the fourth embodiment in that an entire region on the barrier metal 38 is covered by the opaque polysilicon film 36 (first inorganic film).

FIG. 5 depicts the structure of the center portion 1a of the active region 1 of the fifth embodiment. The structure of the outer peripheral portion 1b of the active region 1 and the edge termination region 2 of the fifth embodiment is the same as that of the second embodiment and an entire region on the interlayer insulating film 19 is covered by the opaque polysilicon film 36 (second inorganic film) and therefore, is not described hereinafter (refer to FIG. 2).

In the fifth embodiment, the source electrode 44 is provided in the entire region on the opaque polysilicon film 36, the source electrode 44 is covered by the translucent protective film 34, and the translucent protective film 34 is in contact with the sealing resin 3. The opaque polysilicon film 36 of the fifth embodiment is provided on the source electrode 44 and thus, is a doped polysilicon film with low resistance. Further, an opening (not depicted) is provided in the translucent protective film 34 and a portion of the source electrode 44 exposed in the opening of the translucent protective film 34 constitutes the source pad. FIG. 5 depicts a portion free of the opening. The polysilicon film with a low resistance suffices to have a net impurity concentration of $1\times10^{19}/cm^3$ or greater.

The opaque protective film 35 of the fourth embodiment is an insulating film containing a polyimide and therefore, is not provided in the region of the source pad. On the other hand, the opaque polysilicon film 36 is a conductive film with a low resistance and therefore, covers an entire area of the source electrode 44, including the region of the source pad and may be provided in a region where the source electrode 44 is in contact with the semiconductor substrate 40 (for example, region S in FIG. 5). Thus, in the fifth embodiment, the blue light 60 that is generated by the region where the source electrode 44 is in contact with the semiconductor substrate 40 may also be blocked.

The opaque polysilicon film 36 of the center portion 1a of the active region 1 may be a same film as that of the opaque polysilicon film 36 in the outer peripheral portion 1b of the active region 1 and the edge termination region 2 and may be thinner. In the center portion 1a of the active region 1, the source pad is provided and thus, at least blocking of the blue light 60 suffices. Here, in the contact holes of the interlayer insulating film 19 exposing the $n^+$-type source regions 14 and the $p^{++}$-type contact regions 15, the opaque polysilicon film 36 may be omitted. In other words, the opaque polysilicon film 36 may be provided in an entire area of the surface of the source electrode 44, excluding portions in the contact holes of the interlayer insulating film 19. As described, regions where a current path is formed are free of the opaque polysilicon film 36, whereby constraints related to resistivity of the opaque polysilicon film 36 are eliminated and a non-doped polysilicon film may be used.

As described, in the fifth embodiment as well, the opaque polysilicon film 36 is provided in the center portion 1a of the active region 1. As a result, similarly to the fourth embodiment, the blue light 60 is blocked by the opaque polysilicon film 36 and does not reach the sealing resin 37, whereby degradation of the resin, gel of the sealing resin 37 may be suppressed. Thus, adhesion between the sealing resin 37 and the opaque protective film 35 is favorable, and the reliability of the semiconductor device may be further increased without degradation in the characteristics of the film quality of the interlayer insulating film 19, etc.

Next, a method of manufacturing the silicon carbide semiconductor device according to fifth third embodiment is described. Similar to the first embodiment, in the semiconductor substrate 40, the MOS structure of the active region 1 and the voltage withstanding structure 30 of the edge termination region 2, etc. are formed. Next, the interlayer insulating film 19 is formed at the front surface of the semiconductor substrate 40. Next, an opening is formed in the interlayer insulating film 19 in the center portion 1a of the active region and the barrier metal 38 is formed in the active region 1.

Next, the opaque polysilicon film 36 having a low resistance is formed on the barrier metal 38 in the center portion 1a of the active region 1. The opaque polysilicon film 36 having a low resistance may be formed by depositing non-doped polysilicon by CVD at a temperature of 400 degrees C. or less. Next, the source electrode 44 is formed on the opaque polysilicon film 36 in the center portion 1a of the active region 1.

Next, the opaque polysilicon film 36 is formed on the interlayer insulating film 19 in the outer peripheral portion 1b of the active region 1 and the edge termination region 2. The opaque polysilicon film 36 may be formed by depositing a non-doped polysilicon by CVD at a temperature of 400 degrees C. or less.

Next, the translucent protective film 34 is selectively formed by a polyimide film on the source electrode 44 in the center portion 1a of the active region 1, and on the opaque polysilicon film 36 in the outer peripheral portion 1b of the active region 1 and the edge termination region 2. Thereafter, the same processes as those of the first embodiment are performed, whereby the silicon carbide semiconductor device according to the fifth embodiment may be manufactured.

As described above, according to the silicon carbide semiconductor device of the fifth embodiment, the opaque polysilicon film is provided in the center portion of the active region, the outer peripheral portion of the active region, and the edge termination region. As a result, even in the center portion of the active region, the blue light is blocked by the opaque polysilicon film. Thus, the fifth embodiment has effects similar to those of the fourth embodiment.

Further, while not depicted, the structure of the opaque protective film 35 of the third embodiment may be further provided in the center portion 1a of the active region 1. Furthermore, the opaque protective film 35 provided in the outer peripheral portion 1b of the active region 1 and the edge termination region 2 and the opaque protective film 35 provided in the center portion 1a of the active region 1 may be different from each other. For example, the opaque protective film 35 provided in the center portion 1a of the active region 1 may be an organic black polyimide film while the opaque protective film 35 provided in the outer peripheral portion 1b of the active region 1 and the edge termination region 2 may be an inorganic polysilicon film.

In the foregoing, the present invention may be variously modified within a range not departing from the spirit of the invention, for example, in the embodiments described above, dimensions, impurity concentrations, etc. of regions may be variously set according to necessary specifications. For example, as the opaque protective film, in addition to a polysilicon film, an amorphous silicon film may be used. Furthermore, a semiconductor having a band gap of 2 eV or less may be used. Further, in the embodiments described above, in addition to silicon carbide (SiC), gallium nitride (GaN) or the like may be used as a semiconductor. Further, in the embodiments described above, while a MOSFET is described as an example, application is further possible to a semiconductor device having pn junction therein such as, for example, an IGBT, a pn diode, and a Schottky barrier diode (SBD) employing a junction barrier Schottky (JBS).

According to the invention described above, the first protective film is provided in the outer peripheral portion of the active region and the edge termination region. As a result, the blue light that is generated by the pn junction when forward current passes through the built-in diode, thereby, causing recombination of electrons and holes is blocked by the first protective film. Thus, the blue light does not reach the sealing resin and degradation of the resin, gel of the sealing resin may be suppressed; adhesion between the sealing resin and the first protective film is favorable; and the reliability of the semiconductor device is increased without degradation of the film quality characteristics of the interlayer insulating film, etc.

According to the silicon carbide semiconductor device and the silicon carbide semiconductor device of the present invention, degradation of the sealing resin due to light generated by recombination of electrons and holes in the semiconductor may be suppressed.

As described, the silicon carbide semiconductor device and the method of manufacturing a silicon carbide semiconductor device according to the present invention is useful for power semiconductor devices used in power converting equipment such as inverters, power source devices of various types of industrial machines, automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide and having a first main surface and a second main surface opposite to each other;
an active region provided on the semiconductor substrate;
a termination region provided on the semiconductor substrate and surrounding a periphery of the active region;
a first semiconductor region of a first conductivity type, provided in the semiconductor substrate, spanning the active region and the termination region;
a second semiconductor region of a second conductivity type, provided between the first main surface and the first semiconductor region, in the active region;
a device structure having a first pn junction between the first semiconductor region and the second semiconductor region, in the active region, a first forward current passing through the first pn junction;
a first electrode provided at the first main surface and electrically connected to the second semiconductor region and a second-conductivity-type outer peripheral region;
a second electrode provided at the second main surface and electrically connected to the first semiconductor region; and
a first protective film selectively provided on the first main surface, wherein the active region includes an outer peripheral portion, provided between the first main surface and the first semiconductor region, the outer peripheral portion constituting the second-conductivity-type outer peripheral region that surrounds a periphery of the device structure, the outer peripheral portion forming a second pn junction with the first semiconductor region, a second forward current passing through the second pn junction, the termination region includes a voltage withstanding structure, provided between the first main surface and the first semiconductor region, and the first protective film blocks light generated by the second forward current that passes through the second pn junction.

2. The silicon carbide semiconductor device according to claim 1, wherein
the first protective film is selectively provided at the first main surface.

3. The silicon carbide semiconductor device according to claim 1, wherein
the first protective film is an organic film provided in the termination region and the outer peripheral portion of the active region.

4. The silicon carbide semiconductor device according to claim 1, wherein
the first protective film is a first inorganic film provided in the termination region and the outer peripheral portion of the active region.

5. The silicon carbide semiconductor device according to claim 4, wherein
the first inorganic film is a non-doped polysilicon film or an amorphous silicon film.

6. The silicon carbide semiconductor device according to claim 1, further comprising
a second protective film provided at the first main surface, in the termination region and the outer peripheral portion of the active region, wherein
the first protective film is provided on the second protective film.

7. The silicon carbide semiconductor device according to claim 1, wherein
the first protective film is further provided at an upper portion of the device structure, and blocks light generated by the first forward current that passes through the first pn junction.

8. The silicon carbide semiconductor device according to claim 1, wherein
the first protective film is a second inorganic film provided on the first main surface, in the device structure of the active region.

9. The silicon carbide semiconductor device according to claim 8, wherein
the second inorganic film is a polysilicon film or an amorphous silicon film.

10. The silicon carbide semiconductor device according to claim 8, wherein
the second inorganic film is provided at an entire surface of the first electrode, excluding a portion where the first electrode and the second semiconductor region are in contact with each other.

11. A method of manufacturing a silicon carbide semiconductor device having a semiconductor substrate containing silicon carbide and having a first main surface and a second main surface opposite to each other; an active region provided on the semiconductor substrate; and a termination region provided on the semiconductor substrate and surrounding the active region, the method comprising:

forming a first semiconductor region of a first conductivity type, in the semiconductor substrate, spanning the active region and the termination region;

forming a second semiconductor region of a second conductivity type, between the first main surface and the first semiconductor region, in the active region;

forming a device structure having a first pn junction between the first semiconductor region and the second semiconductor region, a current that passes through the first pn junction flowing through the device structure;

forming, in the active region, an outer peripheral portion of the active region, the outer peripheral portion having a second pn junction between a second-conductivity-type outer peripheral region and the first semiconductor region, the outer peripheral portion forming the second-conductivity-type outer peripheral region between the first main surface and the first semiconductor region, the second-conductivity-type outer peripheral region surrounding a periphery of the device structure;

forming a voltage withstanding structure between the first main surface and the first semiconductor region, in the termination region;

forming a first electrode at the first main surface, the first electrode being electrically connected to the second semiconductor region and the second-conductivity-type outer peripheral region;

forming a second electrode at the second main surface, the second electrode being electrically connected to the first semiconductor region; and selectively forming, on the first main surface, a first protective film blocking light generated by a flow of forward current through the first and second pn junctions.

12. The method according to claim 11, wherein
forming the first protective film includes forming a polyimide film by injecting oxygen during polyimide application.

13. The method according to claim 11, wherein
forming the first protective film includes forming a polyimide film having a thickness of 15 µm or greater.

14. The method according to claim 11, wherein
forming the first protective film includes forming a polysilicon film.

* * * * *